US012795855B2

(12) United States Patent
Jia et al.

(10) Patent No.: US 12,795,855 B2
(45) Date of Patent: Nov. 10, 2026

(54) LIQUID COOLING HEAT DISSIPATION STRUCTURE BASED ON DUAL COOLING PATHS

(71) Applicant: HUAWEI TECHNOLOGIES CO., LTD., Shenzhen (CN)

(72) Inventors: Hui Jia, Shenzhen (CN); Guangjing Wang, Shenzhen (CN); Shanjiu Chi, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 301 days.

(21) Appl. No.: 18/585,360

(22) Filed: Feb. 23, 2024

(65) Prior Publication Data

US 2024/0196563 A1 Jun. 13, 2024

Related U.S. Application Data

(63) Continuation of application No. PCT/CN2022/113930, filed on Aug. 22, 2022.

(30) Foreign Application Priority Data

Aug. 25, 2021 (CN) ........................ 202110979937.8

(51) Int. Cl.
*H05K 7/20* (2006.01)

(52) U.S. Cl.
CPC ..... *H05K 7/20263* (2013.01); *H05K 7/20236* (2013.01); *H05K 7/20272* (2013.01); *H05K 7/20318* (2013.01); *H05K 7/20627* (2013.01)

(58) Field of Classification Search
CPC ........... H05K 7/20236; H05K 7/20772; H05K 7/203; H05K 7/20272; H05K 7/20327;
(Continued)

(56) References Cited

U.S. PATENT DOCUMENTS 7,724,524 B1 * 5/2010 Campbell .......... H05K 7/20772 165/104.19
2014/0124174 A1 5/2014 Campbell et al.
(Continued)

FOREIGN PATENT DOCUMENTS

CN 102342191 B 6/2014
CN 110691490 B 11/2020
WO 2020234600 A1 11/2020

OTHER PUBLICATIONS

Extended European Search Report dated Nov. 8, 2024, issued for European Application No. 22860439.3 (11 pages).
(Continued)

*Primary Examiner* — Mandeep S Buttar

(57) ABSTRACT

A liquid cooling node includes a sealed compartment, a cooling component, two first connectors, and two second connectors. The sealed compartment is filled with a first medium. The cooling component is disposed in the sealed compartment, and the cooling component is filled with a second medium. The first connectors are disposed on a side wall of the sealed compartment, and are communicated with the sealed compartment to form a first cooling path. The second connectors are disposed on the side wall of the sealed compartment, and are communicated with the cooling component to form a second cooling path. A heat dissipation problem of a single high-power main chip can therefore be resolved, so that an entire data center node maintains a low temperature for a long time.

17 Claims, 10 Drawing Sheets

(58) Field of Classification Search
CPC ........... H05K 7/20809; H05K 7/20263; H05K 7/20318; H05K 7/20381; H05K 7/20254; H05K 7/20309; H05K 7/20509; H05K 7/208; H05K 7/20836; H05K 5/067; H05K 7/20763; G06F 1/20; G06F 2200/201; F28D 1/02; H01L 23/473; H01L 23/44
See application file for complete search history.

(56) References Cited

U.S. PATENT DOCUMENTS

| | | | | |
|---|---|---|---|---|
| 2018/0027695 | A1* | 1/2018 | Wakino | H05K 7/20772 361/699 |
| 2019/0239390 | A1 | 8/2019 | Goode et al. | |
| 2019/0297747 | A1 | 9/2019 | Wakino et al. | |
| 2021/0185850 | A1 | 6/2021 | Kulkarni et al. | |
| 2022/0361381 | A1* | 11/2022 | Sweeney | H05K 7/20236 |
| 2022/0408612 | A1* | 12/2022 | Peterson | H05K 7/203 |
| 2023/0156959 | A1* | 5/2023 | Malouin | H05K 7/20263 361/699 |

OTHER PUBLICATIONS

International Search Report dated Nov. 23, 2022, issued for International Application No. PCT/CN2022/113930 (10 pages).

* cited by examiner

LIQUID COOLING HEAT DISSIPATION STRUCTURE BASED ON DUAL COOLING PATHS

CROSS-REFERENCE TO RELATED APPLICATIONS

This application continuation of International Application No. PCT/CN2022/113930, filed on Aug. 22, 2022, which claims priority to Chinese Patent Application No. 202110979937.8, filed on Aug. 25, 2021. The disclosures of the aforementioned applications are hereby incorporated by reference in their entireties.

TECHNICAL FIELD

This disclosure relates to the field of communication cabinet heat dissipation technologies, and in particular, to a liquid cooling heat dissipation structure based on dual cooling paths.

BACKGROUND

As powers of IT device boards and complete cabinets increase, costs of conventional air cooling heat dissipation are increasingly high, and the industry gradually moves toward liquid cooling heat dissipation with higher efficiency. In various liquid cooling heat dissipation technologies, immersion liquid cooling means that a board is immersed in a non-conductive working medium for heat dissipation. This manner uses a simple structure and is easy to implement, and therefore attracts general attention. The immersion liquid cooling may use a single-phase working medium or a two-phase working medium. Details are as follows:

FIG. 1 is a schematic diagram of typical single-phase node immersion liquid cooling. A board with a main chip is immersed in a sealed structure. Cooled heat dissipation working medium liquid is input through a liquid pipe connector 100, and a pump disposed at a periphery of a node drives circulation of hot fluid that is heated up, so that heat generated by the node is dissipated to an external environment.

FIG. 2 and FIG. 3 are schematic diagrams of typical two-phase node immersion liquid cooling. A non-conductive working medium whose boiling point is lower than a boiling point of water performs gas-liquid two-phase conversion at a specific temperature and pressure, to take away heat of a heat source. Because gas can automatically rise under an action of buoyancy, a condenser 101 may be disposed in a node by a system, and condense gas of the working medium into liquid that automatically drops, and the condenser takes away heat by using cooling water (FIG. 2). Alternatively, gas and liquid phases automatically rise, and finally a gas-phase working medium is condensed into a liquid phase by using a condenser in an external heat exchange module, and then liquid is transferred back into a node for a next heat dissipation cycle by using a pump in the heat exchange module (FIG. 3).

However, in this manner, a liquid flow speed and a liquid supplement speed at a main chip are not high enough, and heat dissipation areas and vaporization cores are not enough. When power of the chip is higher than a value, a heat dissipation bottleneck occurs, and a heat dissipation problem cannot be resolved.

SUMMARY

This disclosure provides a liquid cooling heat dissipation structure based on dual cooling paths, to resolve a heat dissipation problem of a single high-power main chip, so that an entire data center node maintains a low temperature for a long time.

A first aspect of this disclosure provides a liquid cooling node, including a sealed compartment, at least one cooling component, two first connectors, and two second connectors. The sealed compartment is filled with a first medium. The at least one cooling component is disposed in the sealed compartment, and the cooling component is filled with a second medium. The first connectors are disposed on a side wall of the sealed compartment, and are configured to be communicated with the sealed compartment to form a first cooling path. The second connectors are disposed on the side wall of the sealed compartment, and are configured to be communicated with the at least one cooling component to form a second cooling path.

The foregoing liquid cooling node includes the sealed compartment, the at least one cooling component, the two first connectors, and the two second connectors. The sealed compartment is filled with the first medium. A circuit board with chips is disposed in the sealed compartment and the chips include a main chip and a non-main chip. At least a part of the circuit board is immersed in the first medium, to take away heat on the circuit board through circulation of the first medium, and perform overall cooling on the circuit board. The at least one cooling component is disposed in the sealed compartment, and the cooling component is filled with the second medium. The cooling component is in contact with the main chip on the circuit board, and the second medium that flows at a high speed in the cooling component may quickly take away heat of the main chip, to perform local enhanced cooling on the main chip, thereby meeting a heat dissipation requirement of the main chip. The two first connectors are disposed on the side wall of the sealed compartment, and the first connectors are configured to be communicated with the sealed compartment to form the first cooling path, so that the first medium can complete heat exchange outside the liquid cooling node, and the first medium in the liquid cooling node can maintain a low temperature for a long time, thereby improving heat dissipation efficiency of the first medium. The two second connectors are disposed on the side wall of the sealed compartment, and are configured to be communicated with the cooling component to form the second cooling path, so that the second medium can complete heat exchange outside the liquid cooling node, and the second medium in the cooling component can maintain a low temperature for a long time, thereby improving heat dissipation efficiency of the second medium. The liquid cooling node absorbs, by using the cooling component with high heat dissipation effect, the heat dissipated by the main chip, and absorbs, by using the first medium with limited heat dissipation effect, heat dissipated by a component other than the main chip, and both the first medium and the second medium that is in the cooling component complete heat exchange outside the liquid cooling node. Therefore, a heat dissipation problem of the single high-power main chip can be resolved, so that the entire liquid cooling node maintains a low temperature for a long time.

Optionally, a heat generation component is disposed in the sealed compartment, the cooling component forms a closed structure, the cooling component is attached to a surface of the heat generation component, and a runner is disposed inside the cooling component. When a cooling medium flows through the runner, heat generated by the heat generation component can be efficiently taken away.

Optionally, a heat generation component is disposed in the sealed compartment, the cooling component is disposed as a cavity structure with an opening on one side, an opening side of the cooling component is connected to the heat generation component, and the heat generation component closes the opening side of the cooling component to form a closed structure, so that a cooling medium is in direct contact with the heat generation component, thereby taking away heat generated by the heat generation component more efficiently.

Optionally, the first medium and the second medium are a same type of cooling liquid. In this way, an arrangement of a heat exchange line outside the liquid cooling node can be simplified.

Optionally, the first medium and the second medium are different types of cooling liquid, to meet a complex cooling requirement in the liquid cooling node.

Optionally, the first medium is a non-aqueous single-phase working medium, and this structure is applicable to both a horizontally inserted node and a vertically inserted node.

Optionally, the liquid cooling node is a vertically inserted node, the first medium is a non-aqueous two-phase working medium, and the two first connectors are arranged in a vertical direction.

Optionally, the second medium is an aqueous working medium. Because a physical property of water is far stronger than a physical property of a non-aqueous working medium (for example, fluoride liquid or oil), a higher heat dissipation capability of the main chip can be supported, and the heat dissipation capability can be improved by more than 20%. Therefore, based on node immersion, evolution of a chip with higher power can be further supported, and efficient heat dissipation of the main chip and peripheral components of the main chip is efficiently implemented, thereby conveniently implementing decoupling between a board and liquid cooling heat dissipation.

Optionally, the at least one cooling component is a plurality of cooling components, and the cooling components are communicated with each other. Because the cooling component is disposed flexibly, the liquid cooling node can flexibly adapt to various configurations and various circuit boards, to implement decoupling between the heat dissipation structure and hardware of the circuit boards, and improve efficiency of a heat dissipation system.

Optionally, the first connectors are quick blind-mate connectors. In this way, no manual connection operation is required. Provided that the liquid cooling node is properly installed on a cabinet body, the quick blind-mate connectors can be automatically connected, and is easy to operate and convenient to use.

Optionally, the second connectors are quick blind-mate connectors. In this way, no manual connection operation is required. Provided that the liquid cooling node is properly installed on a cabinet body, the quick blind-mate connectors can be automatically connected, and is easy to operate and convenient to use.

Optionally, the circuit board is disposed in the sealed compartment, and the main chip and the non-main chip are disposed on the circuit board.

The main chip is in contact with the cooling component, and at least a part of the non-main chip is immersed in the first medium.

A second aspect of this disclosure provides a liquid cooling heat dissipation cabinet, including a cabinet body, any liquid cooling node provided in this disclosure, a first flow distribution unit, and a second flow distribution unit. There are a plurality of liquid cooling nodes, and the liquid cooling nodes are detachably installed on the cabinet body. The first flow distribution unit is configured to distribute a first medium, one of the first connectors of the liquid cooling node is communicated with a liquid inlet side of the first flow distribution unit, and the other one of the first connectors is communicated with a liquid outlet side of the first flow distribution unit. The second flow distribution unit is configured to distribute a second medium, one of the second connectors of the liquid cooling node is communicated with a liquid inlet side of the second flow distribution unit, and the other one of the second connectors is communicated with a liquid outlet side of the second flow distribution unit.

Optionally, the first flow distribution unit and the second flow distribution unit are disposed on a same side of the cabinet body, so that an overall structure is more compact.

Optionally, the first flow distribution unit and the second flow distribution unit are disposed on different sides of the cabinet body, so that an overall structure is more flexibly arranged.

Optionally, the liquid cooling heat dissipation cabinet includes one heat exchange module, the heat exchange module includes two heat exchange branches that are not communicated with each other, the first flow distribution unit is communicated with one of the heat exchange branches, and the second flow distribution unit is communicated with the other one of the heat exchange branches, so that heat exchange is simultaneously performed for the first medium and the second medium by using the same heat exchange module.

Optionally, the liquid cooling heat dissipation cabinet includes two heat exchange modules, the first flow distribution unit is communicated with one of the heat exchange modules, and the second flow distribution unit is communicated with the other one of the heat exchange modules.

It should be understood that the foregoing general description and the following detailed description are merely examples, and cannot limit this disclosure.

REFERENCE NUMERALS

Figure 1:
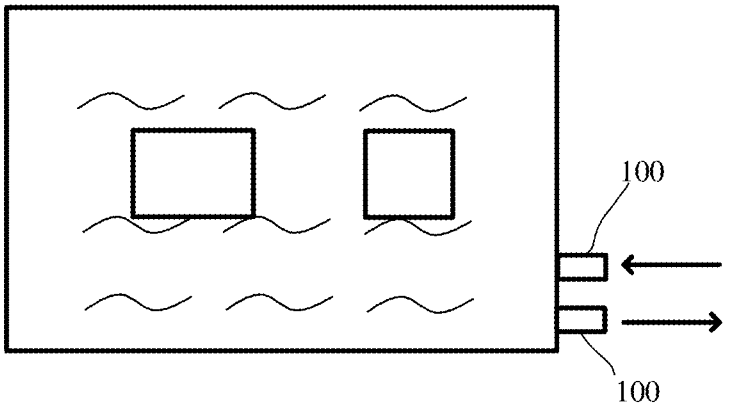
FIG. 1 (PRIOR ART)
FIG. 1 is a schematic diagram of a structure of single-phase immersion liquid cooling in a conventional technology.
Figure 2:
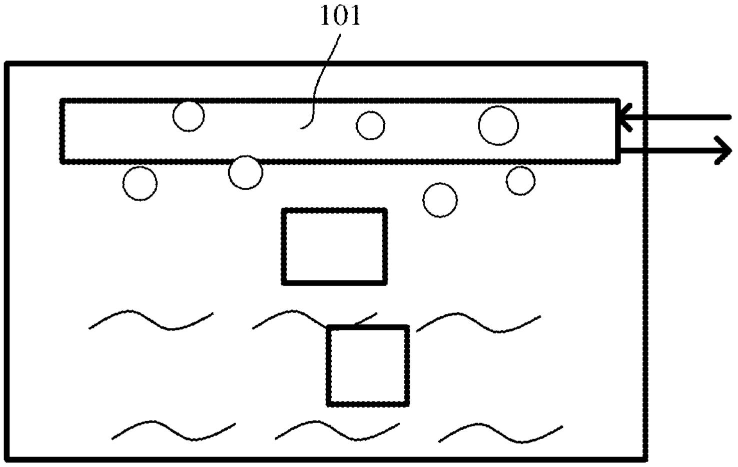
FIG. 2 (PRIOR ART)
FIG. 2 is a schematic diagram of a structure of two-phase node immersion liquid cooling in the conventional technology.
Figure 3:
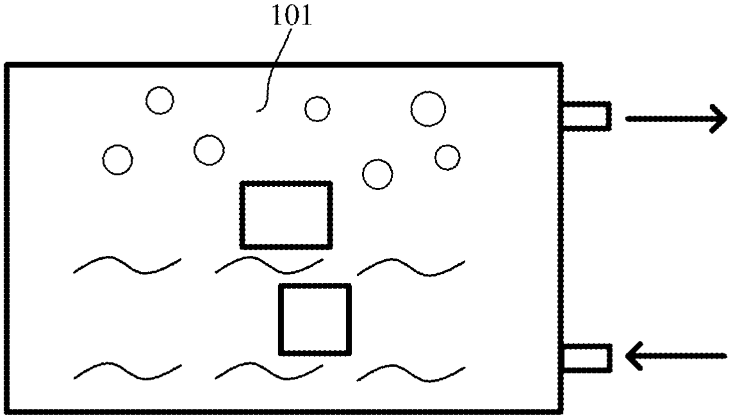
FIG. 3 (PRIOR ART)
FIG. 3 is a schematic diagram of a structure of another two-phase node immersion liquid cooling in the conventional technology.

100: liquid pipe connector;
101: condenser;
102: cooling unit;
103: coolant tank;
111: liquid supply pipeline;
112: liquid return pipeline;
115: fluid pump;
1: cabinet body;
  11: chassis;
4: liquid cooling node;
  41: sealed compartment;
  42: cooling component;
  43: first connector;
  44: second connector;
  45: cooling pipe;
  46: circuit board;
  47: main chip;
  48: condenser;
5: first flow distribution unit;
6: second flow distribution unit;
7: heat exchange module;
  71: heat exchange branch;
  72: primary side;
  73: drive pump;
8: hose.

The accompanying drawings herein are incorporated into the specification and constitute a part of the specification, show embodiments conforming to this disclosure, and are used together with the specification to explain a principle of this disclosure.

DESCRIPTION OF EMBODIMENTS

For ease of understanding technical solutions of this disclosure, the following describes embodiments of this disclosure in detail with reference to accompanying drawings.

Terms used in embodiments of this disclosure are merely for the purpose of describing specific embodiments, but are not intended to limit this disclosure. The terms “a”, “the”, and “this” of singular forms used in embodiments and the appended claims of this disclosure are also intended to include plural forms, unless otherwise specified in the context clearly.

It should be understood that the term “and/or” in this specification describes only an association relationship for describing associated objects and represents that three relationships may exist. For example, A and/or B may represent the following three cases: Only A exists, both A and B exist, and only B exists. In addition, the character “/” in this specification generally represents an “or” relationship between the associated objects.

It should be noted that orientation words such as “above”, “below”, “left”, and “right” described in embodiments of this disclosure are described from perspectives shown in the accompanying drawings, and should not be construed as a limitation on embodiments of this disclosure. Moreover, in the context, it should also be understood that, when it is mentioned that one element is connected “above” or “below” another element, the element can be directly connected “above” or “below” the another element, or may be indirectly connected “above” or “below” the another element through an intermediate element.

An embodiment of this disclosure provides a liquid cooling heat dissipation cabinet, including a cabinet body. A switch, a power supply box, a plurality of liquid cooling nodes, and the like may be installed in the cabinet body, to implement a data communication function. The liquid cooling node may be a pluggable service processing circuit board unit, that is, the liquid cooling node is detachably connected to the cabinet body. The liquid cooling node may be installed in the cabinet body in a horizontal insertion manner, or may be installed in the cabinet in a vertical insertion manner. The liquid cooling node generally has a high heat dissipation requirement, and the liquid cooling node may dissipate heat in an immersion liquid cooling manner.

Figure 4:
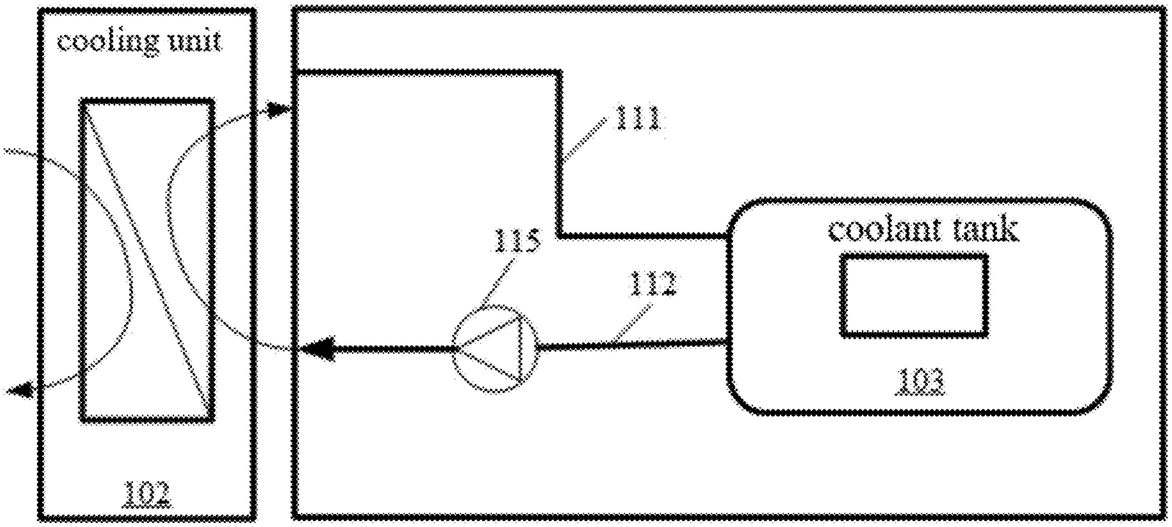
FIG. 4 is a schematic diagram of a structure of an existing immersion liquid cooling system.

Refer to FIG. 4. An immersed coolant tank 103 is disposed inside the liquid cooling node, and a cooling unit 102 (for example, an indirect evaporative cooling (IDEC) system) is disposed outside the liquid cooling node. The coolant tank 103 is connected to the external cooling unit through a liquid supply pipeline 111 and a liquid return pipeline 112 to form a cooling loop. A fluid pump 115 is disposed in the cooling loop for driving, and heat is transferred from the cooling loop to the atmosphere by using the externally disposed cooling unit. The liquid cooling node generally includes a main chip (for example, a CPU or a GPU, characterized by high power and a large heat dissipation amount) and a non-main chip (for example, a memory module or a hard disk, characterized by low power and a small heat dissipation amount). However, immersed liquid cooling of the node has a low flow speed and a cooling system has low operating efficiency. As a result, a heat dissipation capability of this manner is limited, only a heat dissipation requirement of the non-main chip can be met, and a heat dissipation requirement of the main chip with high power consumption cannot be met. Therefore, a new solution needs to be proposed to resolve a heat dissipation problem of the main chip.

Figure 5:
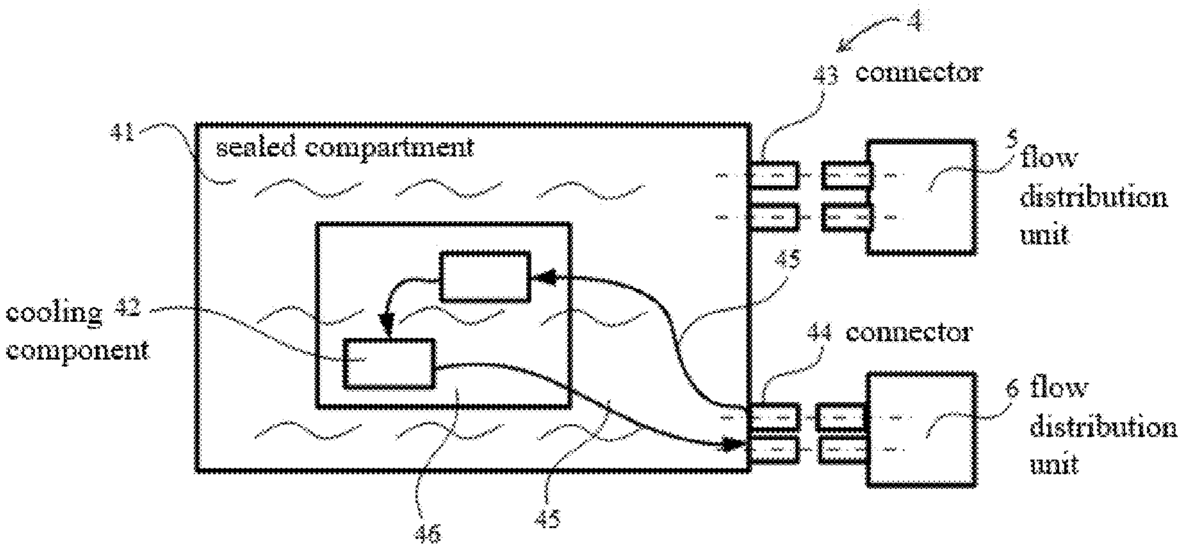
FIG. 5 is a schematic diagram of a structure of an immersion liquid cooling system according to an embodiment of this disclosure.

As shown in FIG. 5, an embodiment of this disclosure provides a liquid cooling node 4, including a sealed compartment 41, a cooling component 42, two first connectors 43, and two second connectors 44. The sealed compartment

41 is filled with a first medium. A heat generation component is disposed in the sealed compartment 41. For example, a circuit board 46 with chips is disposed in the sealed compartment 41 and the chips include a main chip 47 (for example, a CPU or a GPU, characterized by high power and a large heat dissipation amount) and a non-main chip (for example, a memory module or a hard disk, characterized by low power and a small heat dissipation amount). At least a part of the circuit board 46 is immersed in the first medium, to take away heat on the circuit board 46 through circulation of the first medium, and perform overall cooling on the circuit board 46. The cooling component 42 is disposed in the sealed compartment 41, and the cooling component 42 is filled with a second medium. The cooling component 42 is in contact with the main chip 47 on the circuit board 46, and the second medium that flows at a high speed in the cooling component 42 may quickly take away heat of the main chip 47, to perform local enhanced cooling on the main chip 47, thereby meeting a heat dissipation requirement of the main chip 47. The two first connectors 43 are disposed on a side wall of the sealed compartment 41, and the first connectors 43 are communicated with the sealed compartment 41 to form a first cooling path, that is, the two first connectors 43 respectively form a liquid inlet and a liquid outlet of the first medium, so that the first medium can complete heat exchange outside the liquid cooling node 4, and the first medium in the liquid cooling node 4 can maintain a low temperature for a long time, thereby improving heat dissipation efficiency of the first medium. The two second connectors 44 are disposed on the side wall of the sealed compartment 41, and the cooling component 42 is communicated with the second connectors 44 through a cooling pipe 45, to form a second cooling path, that is, the two second connectors 44 respectively form a liquid inlet and a liquid outlet of the second medium, so that the second medium can complete heat exchange outside the liquid cooling node 4, and the second medium in the cooling component 42 can maintain a low temperature for a long time, thereby improving heat dissipation efficiency of the second medium.

The cooling component 42 may be a conventional cold plate structure, to be specific, the cooling component 42 forms a closed structure, the cooling component 42 is attached to the main chip 47, and a runner is disposed inside the cooling component 42. When a cooling medium flows through the runner, the heat generated by the main chip can be efficiently taken away. The cooling component 42 may alternatively be a cold plate structure based on internal spraying, to be specific, the cooling component 42 is disposed as a cavity structure with an opening on one side, an opening side of the cooling component 42 is connected to the main chip 47, and the main chip 47 closes the opening side of the cooling component 42 to form a closed structure. A nozzle is disposed in the cooling component 42, and a cooling medium is sprayed to the main chip 47 through the nozzle, so that the cooling medium is in direct contact with the main chip 47, thereby more efficiently taking away the heat generated by the main chip 47. The liquid cooling node 4 absorbs, by using the cooling component 42 with high heat dissipation effect, the heat dissipated by the main chip 47, and absorbs, by using the first medium with limited heat dissipation effect, heat dissipated by a component other than the main chip 47, and both the first medium and the second medium that is in the cooling component 42 complete heat exchange outside the liquid cooling node 4. Therefore, a heat dissipation problem of the single high-power main chip 47 can be resolved, so that the entire liquid cooling node 4 maintains a low temperature for a long time.

Figure 6:
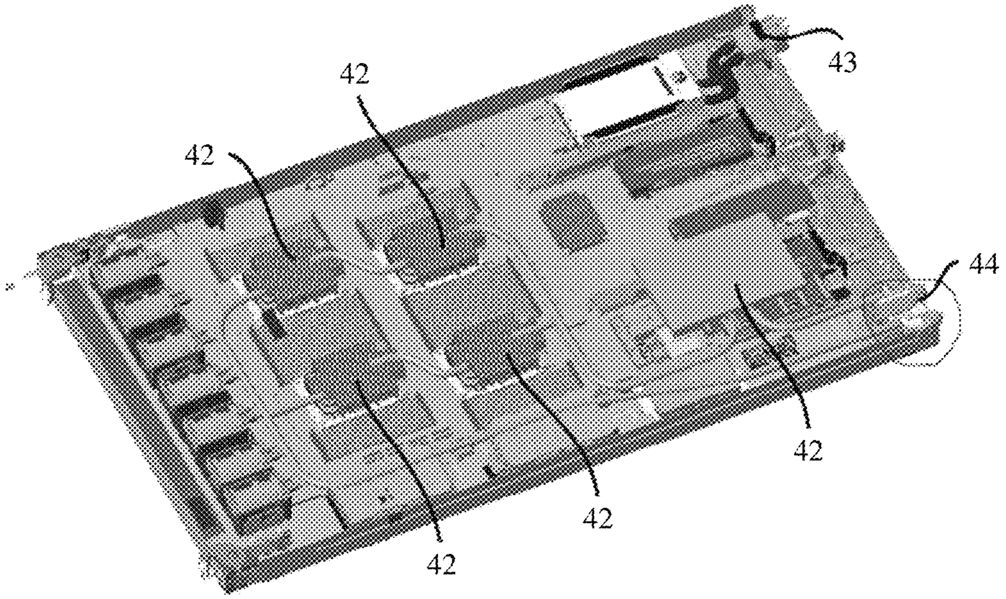
FIG. 6 is a schematic diagram of a structure of an arrangement of a cooling component according to an embodiment of this disclosure.
Figure 7:
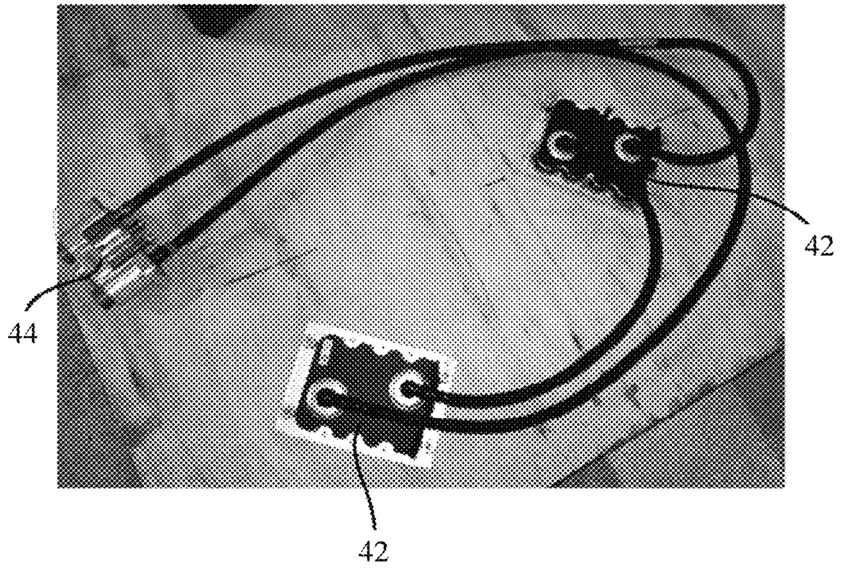
FIG. 7 is a schematic diagram of a structure of another arrangement of a cooling component according to an embodiment of this disclosure.
Figure 8:
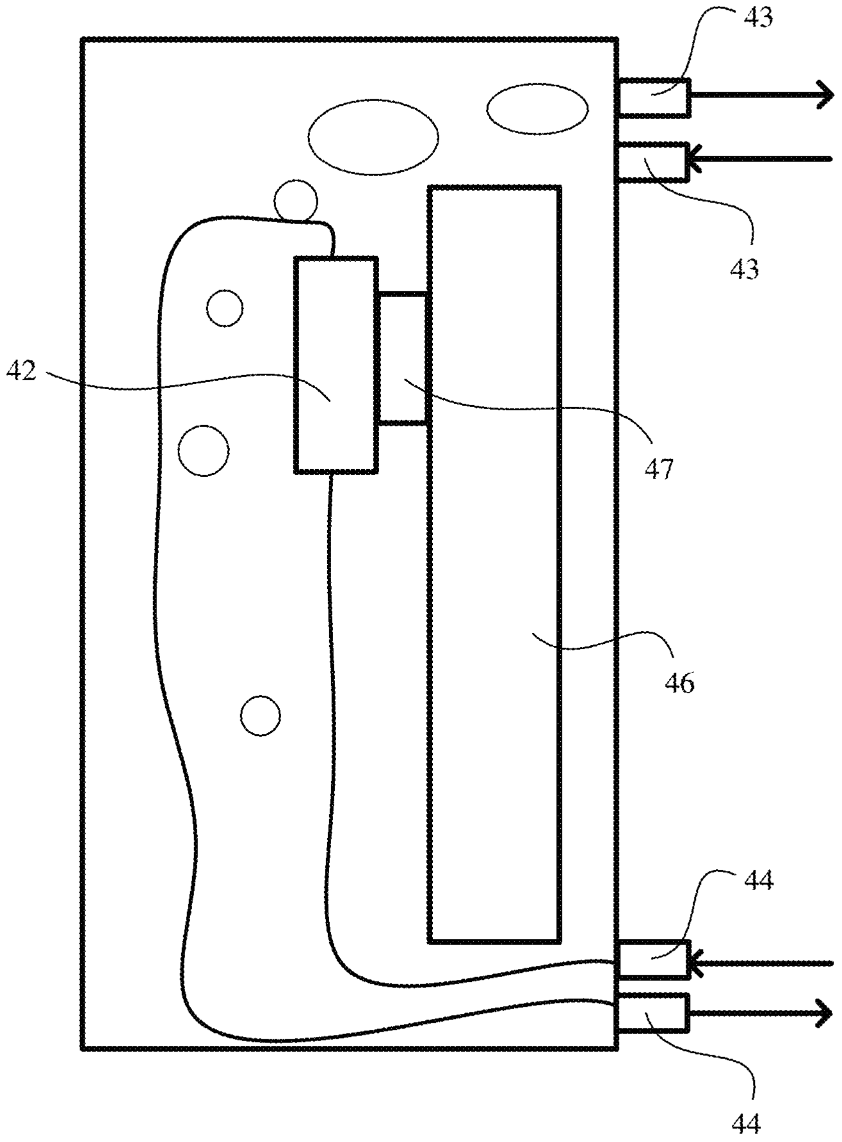
FIG. 8 is a schematic diagram of a structure of a vertically inserted node according to an embodiment of this disclosure.
Figure 9:
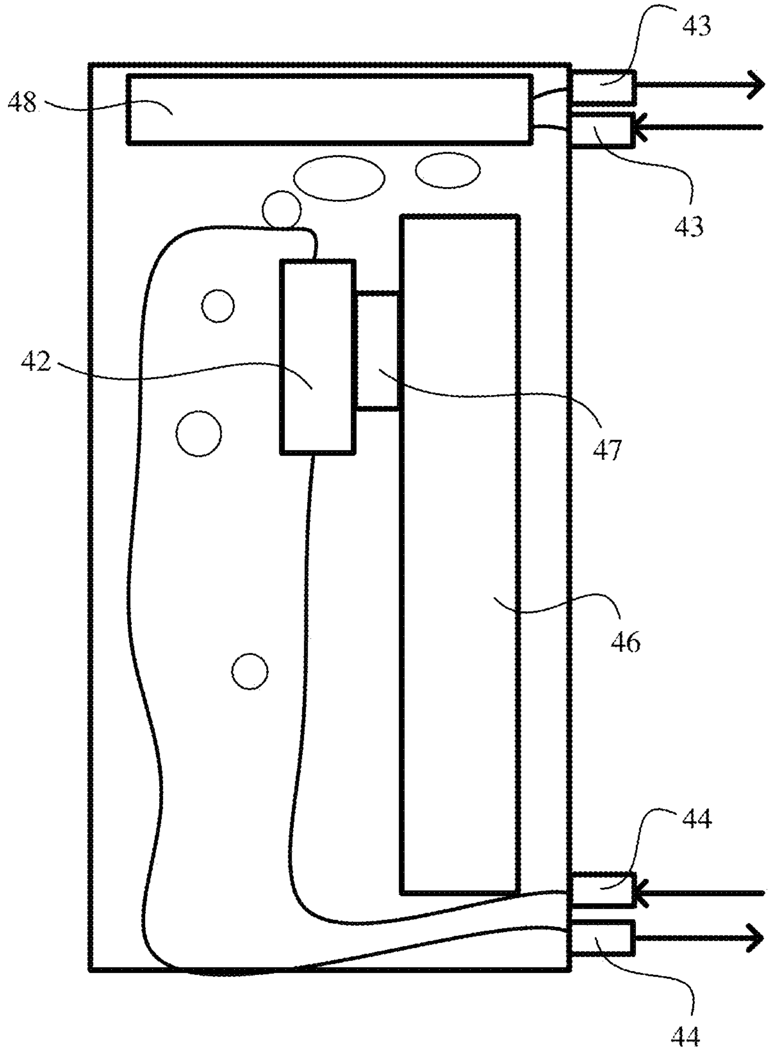
FIG. 9 is a schematic diagram of a structure of another vertically inserted node according to an embodiment of this disclosure.

As shown in FIG. 6 and FIG. 7, a quantity of the cooling components 42 may be properly set based on a heat dissipation requirement. For example, the quantity of the cooling components 42 may be one, two, three, four, five, or the like. A quantity of the cooling components 42 in FIG. 8 is five, and a quantity of the cooling components 42 in FIG. 9 is two. The cooling components 42 are directly attached to a surface of the main chip 47 to form reliable contact cooling for the main chip 47. When the quantity of the cooling components 42 is two or more, the cooling components 42 may be connected in series or in parallel through the cooling pipe 45, and then connected to the second connectors 44 through the cooling pipes 45. Because the cooling component 42 is disposed flexibly, the liquid cooling node 4 can flexibly adapt to various configurations and various circuit boards 46, to implement decoupling between a heat dissipation structure and hardware of the circuit boards 46, and improve efficiency of a heat dissipation system.

The first medium and the second medium may be a same type of cooling liquid, to simplify an arrangement of a heat exchange line outside the liquid cooling node 4. The first medium and the second medium may be different types of cooling liquid, to meet a complex cooling requirement in the liquid cooling node 4. For example, a cooling capability of the second medium may be greater than a cooling capability of the first medium; cooling liquid with a higher cooling capability is used to cool the main chip with a higher heat dissipation amount, to form reliable heat dissipation effect; and cooling liquid with a lower cooling capability is used to cool another heat dissipation component other than the main chip, to avoid a waste caused by a cooling capability greater than a heat dissipation requirement.

In an embodiment, the first medium and the second medium are a same type of cooling liquid, and the first medium and the second medium may implement different cooling effect by using different pressures. For example, the first medium is a low-pressure non-aqueous working medium, to avoid that an excessively high pressure generated in the liquid cooling node 4 affects a service life of the liquid cooling node 4; and the second medium is a high-pressure non-aqueous working medium, and a flow speed of the second medium is increased, thereby improving heat dissipation effect of the main chip 47.

In an embodiment, the first medium is a non-conductive non-aqueous working medium, and the second medium may be a non-conductive non-aqueous working medium, or may be an aqueous working medium. The non-aqueous working medium may be a single-phase liquid working medium (to be specific, a single-phase liquid state is always maintained within an operating temperature), for example, FC43, mineral oil, or vegetable oil. In this case, the first medium needs to flow into a heat exchange module 7 through the first connector 43, and heat exchange is completed in the heat exchange module 7. This structure is applicable to both a horizontally inserted node and a vertically inserted node. The non-aqueous working medium may be a phase change working medium (to be specific, mutual conversion between liquid and gas may be implemented at a design temperature), for example, FC72 or Novec7000. A boiling point of the non-aqueous working medium is lower than a boiling point of water, and an atmospheric boiling point is generally between 30° C. and 60° C.

Further, refer to FIG. 8. When the first medium is a phase change working medium, the first medium may flow out of the liquid cooling node 4 through the first connector 43, complete heat exchange outside the liquid cooling node 4, and then cool to form a liquid droplet and flow back into the liquid cooling node 4. This structure is mainly used for a vertically inserted node, and the two first connectors 43 are arranged in a vertical direction. The lower first connector 43 is a medium inlet, and the upper first connector 43 is a medium outlet.

Further, refer to FIG. 9. When the first medium is a phase change working medium, a condenser 48 may be built in the liquid cooling node 4, and a phase change working medium that is in a gas state and that absorbs heat in the liquid cooling node 4 exchanges heat with the built-in condenser 48, so that the gasified phase change working medium is condensed into liquid that drops and returns to a phase change working medium in liquid. Liquid in the built-in condenser 48 flows out of the liquid cooling node 4 through the first connector 43, and completes heat exchange outside the liquid cooling node 4. This structure is applicable to both a horizontally inserted node and a vertically inserted node.

In another embodiment, the first medium is a non-conductive non-aqueous working medium, and the second medium is an aqueous working medium. Because a physical property of water is far stronger than a physical property of a non-aqueous working medium (for example, fluoride liquid or oil), a higher heat dissipation capability of the main chip 47 can be supported, and the heat dissipation capability can be improved by more than 20%. Therefore, based on node immersion, evolution of a chip with higher power can be further supported, and efficient heat dissipation of the main chip 47 and peripheral components of the main chip 47 is efficiently implemented, thereby conveniently implementing decoupling between a board and liquid cooling heat dissipation.

In still another embodiment, the first medium is a non-conductive non-aqueous working medium, and the second medium may be liquid with latent heat of vaporization greater than 500 KJ/kg, for example, freon or alcohol, or may be a heat dissipation medium, for example, liquid carbon dioxide or liquid metal under an ultra-high pressure. As the power of the main chip 47 continuously increases, the heat dissipated by the main chip 47 continuously increases, and the heat dissipation requirement also continuously increases. This type of second medium may further improve the heat dissipation effect of the cooling component 42.

Further, the first connectors 43 and the second connectors 44 may be disposed at a rear part that is of the sealed compartment 41 and that is in an insertion and removal direction, to avoid that the first connectors 43 and the second connectors 44 occupy internal space of a cabinet body 1. At least one of the first connector 43 and the second connector 44 may be a quick blind-mate connector. A floating apparatus is disposed on the quick blind-mate connector. No manual connection operation is required. Provided that the liquid cooling node 4 is properly installed on the cabinet body 1, the quick blind-mate connector can be automatically connected, and is easy to operate and convenient to use. Certainly, the first connectors 43 and the second connectors 44 may alternatively be hose-connected quick connectors or hand-plug quick connectors. In this case, after the liquid cooling node 4 is properly installed, the connectors need to be communicated in a manual operation manner. Liquid leakage control of the first connectors 43 and the second connectors 44 may be implemented based on features of quick connectors. Specifically, the quick connectors are fluid connectors, and may be automatically closed when disconnected, and may implement liquid conduction when connected.

Figure 10:
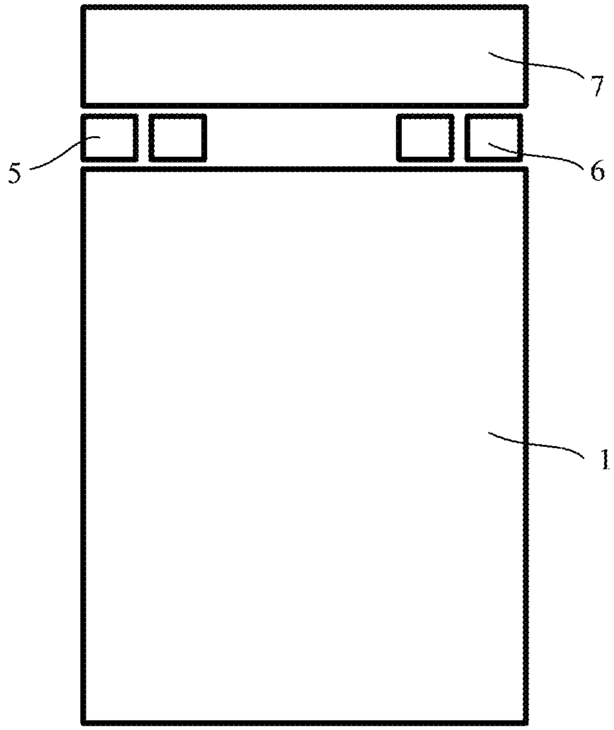
FIG. 10 is a schematic diagram of a structure of an arrangement of a liquid cooling heat dissipation cabinet according to an embodiment of this disclosure.

As shown in FIG. 10, the liquid cooling heat dissipation cabinet provided in this embodiment of this disclosure further includes two flow distribution units and at least one heat exchange module 7. The liquid cooling node 4 is connected to the flow distribution units and the heat exchange module 7, to form a cooling loop to reduce a temperature of a data center. The heat exchange module 7 is also referred to as a coolant distribution unit (that is, the Coolant distribution unit, CDU for short), mainly includes components such as a pump and a heat exchanger, and is configured to transfer liquid and control a temperature of liquid flowing into the liquid cooling node 4. The two flow distribution units are respectively a first flow distribution unit 5 and a second flow distribution unit 6. The first flow distribution unit 5 is communicated with the first connectors 43, and the second flow distribution unit 6 is communicated with the second connectors 44.

Specifically, the heat exchange module 7 includes a primary side 72 and a secondary side that are not communicated with each other, and the primary side 72 and the secondary side can exchange heat with each other. The primary side 72 of the heat exchange module 7 is communicated with external liquid, so that the low-temperature external liquid flows into the heat exchange module 7 to cool the secondary side of the heat exchange module 7. The liquid cooling node 4 is connected to the secondary side of the heat exchange module 7 through the flow distribution units, so that liquid in the liquid cooling node 4 can flow into the secondary side of the heat exchange module 7 for cooling.

Figure 11:
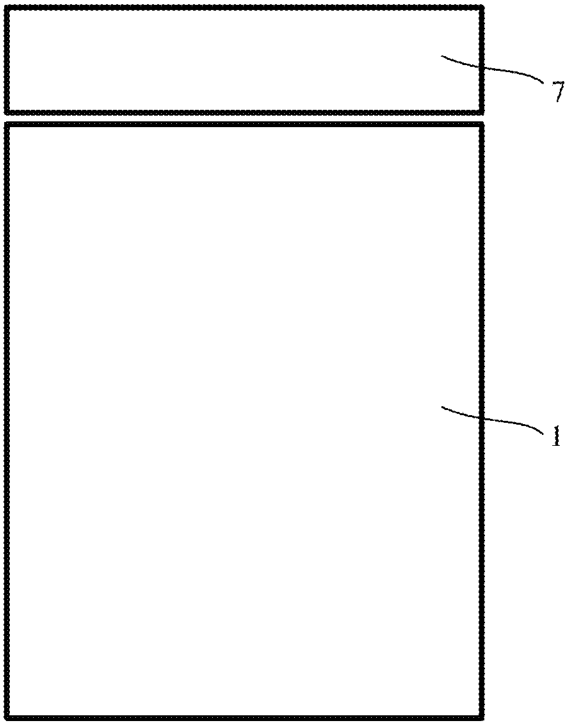
FIG. 11 is a schematic diagram of a structure of a first arrangement of a heat exchange module according to an embodiment of this disclosure.
Figure 12:
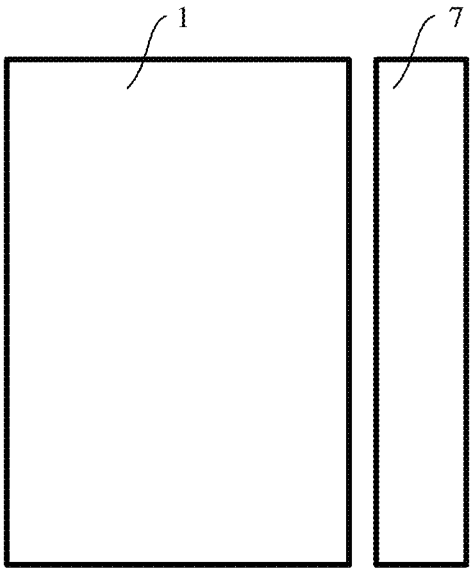
FIG. 12 is a schematic diagram of a structure of a second arrangement of a heat exchange module according to an embodiment of this disclosure.
Figure 13:
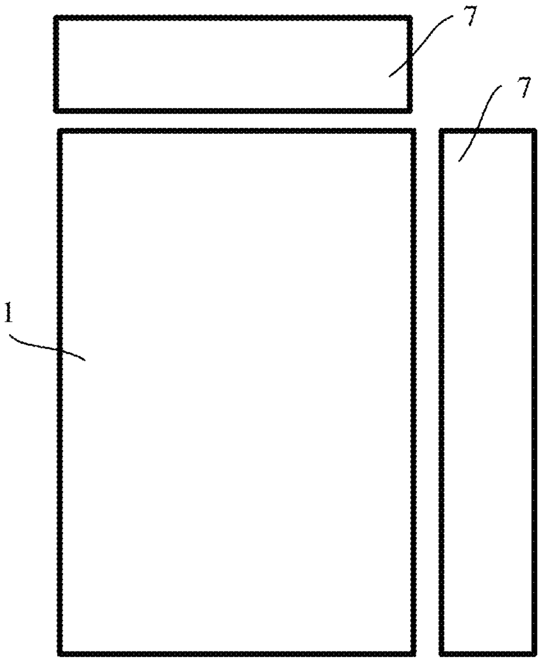
FIG. 13 is a schematic diagram of a structure of a third arrangement of a heat exchange module according to an embodiment of this disclosure.

As shown in FIG. 11 to FIG. 13, the heat exchange module 7 may be located on a back of the cabinet body 1 (that is, behind the cabinet body 1) or may be located on a side of the cabinet body 1, or the heat exchange modules 7 may be located on both a back and a side of the cabinet body 1. The heat exchange module 7 may further occupy height space of the cabinet body 1. For example, the heat exchange module 7 is disposed at a bottom, in a middle, or on a top of the cabinet body 1. The heat exchange module 7 may be a box separately disposed outside the cabinet body 1, or may be directly disposed inside the cabinet body 1. The liquid cooling heat dissipation cabinet may include one heat dissipation module, or may include a plurality of heat dissipation modules.

Figure 14:
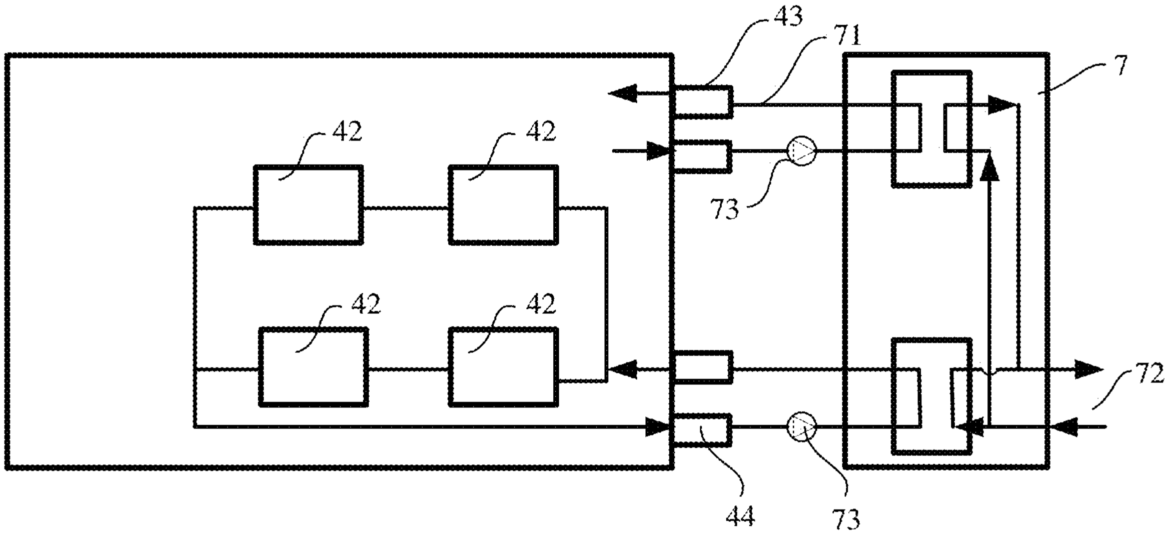
FIG. 14 is a schematic diagram of a structure of a connection between a heat exchange module and a liquid cooling node according to an embodiment of this disclosure.

As shown in FIG. 14, in an embodiment, the liquid cooling heat dissipation cabinet includes one heat exchange module 7, and the heat exchange module 7 includes two heat exchange branches 71 that are not communicated with each other, that is, the two heat exchange branches 71 are disposed on a secondary side of the heat exchange module 7. A separate drive pump 73 is disposed on each heat exchange branch 71. A purification apparatus may be further disposed on the heat exchange branch 71 based on a requirement. The first flow distribution unit 5 is communicated with one of the heat exchange branches 71, and the second flow distribution unit 6 is communicated with the other one of the heat exchange branches 71. In this case, the heat of the main chip 47 is taken away by using the first medium and the cooling components 42, and the heat of a component other than the main chip 47 is taken away through circulation of the second medium. Both the first medium and the second medium perform heat exchange with a third stream of a cooling working medium (a primary side 72 of the heat exchange module 7) outside the liquid cooling node 4, so that the same heat exchange module 7 simultaneously performs heat exchange for the first medium and the second medium, and can further simultaneously provide circulation power for the first medium and the second medium. The two heat exchange branches 71 may be staggered in space. For example, the two heat exchange branches 71 are sequentially arranged in a vertical direction, or the two heat exchange branches 71 are staggered in a horizontal direction.

Figure 15:
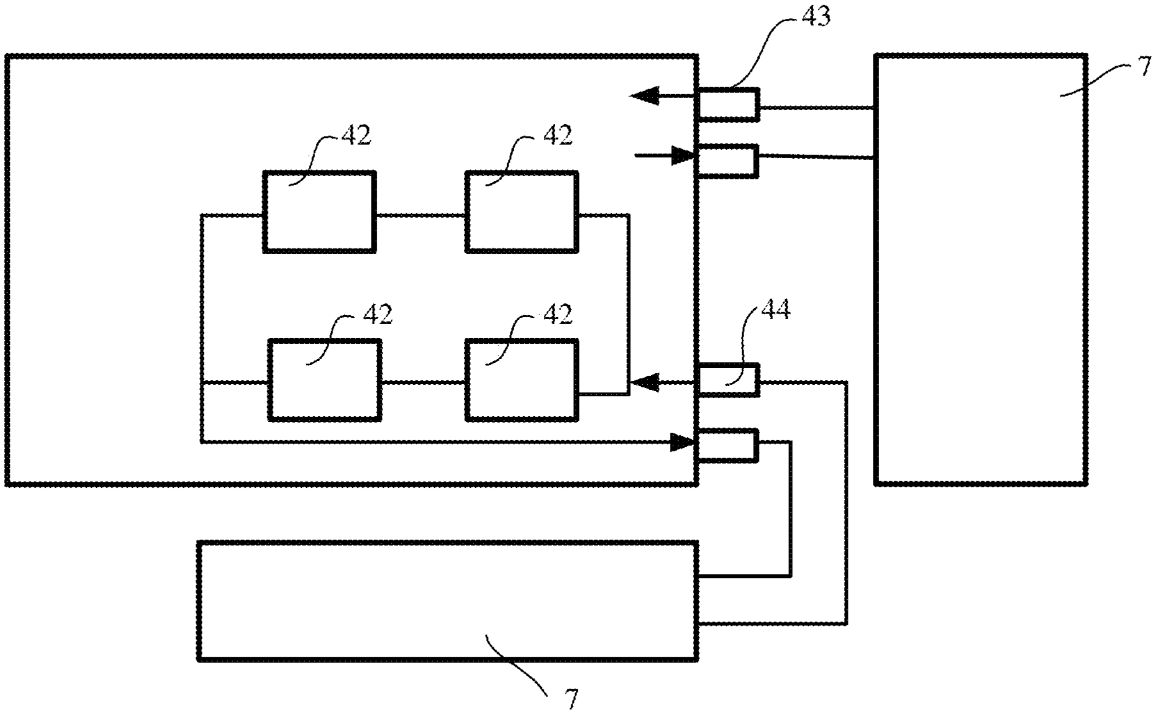
FIG. 15 is a schematic diagram of a structure of another connection between heat exchange modules and a liquid cooling node according to an embodiment of this disclosure.

As shown in FIG. 15, in another embodiment, the liquid cooling heat dissipation cabinet includes at least two heat exchange modules 7. A separate drive pump 73 is disposed in each heat exchange module 7. A purification apparatus may be further disposed in the heat exchange module 7 based on a requirement. The first flow distribution unit 5 is communicated with one of the heat exchange modules 7, and the second flow distribution unit 6 is communicated with the other one of the heat exchange modules 7, so that the first medium exchanges heat with a third stream of a cooling working medium (a primary side 72 of the heat exchange module 7) in one of the heat exchange modules 7. The second medium exchanges heat with the third current of the cooling working medium (a primary side 72 of the heat exchange module 7) in the other one of the heat exchange modules 7.

Figure 16:
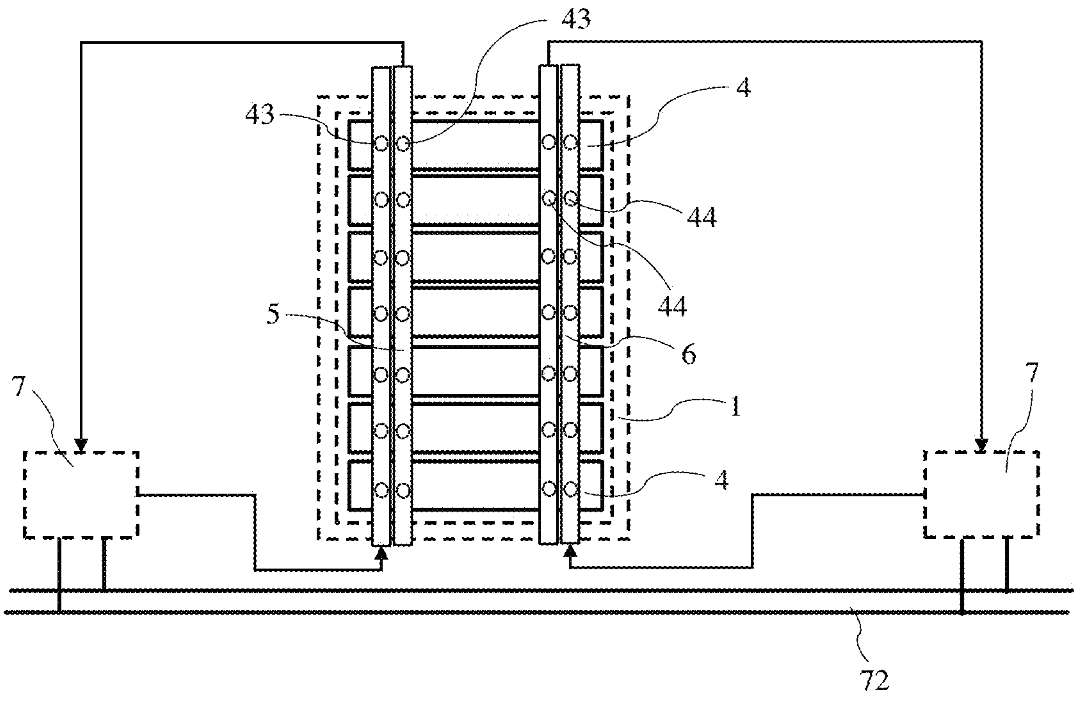
FIG. 16 is a schematic diagram of a structure of a connection of flow distribution units according to an embodiment of this disclosure.
Figure 17:
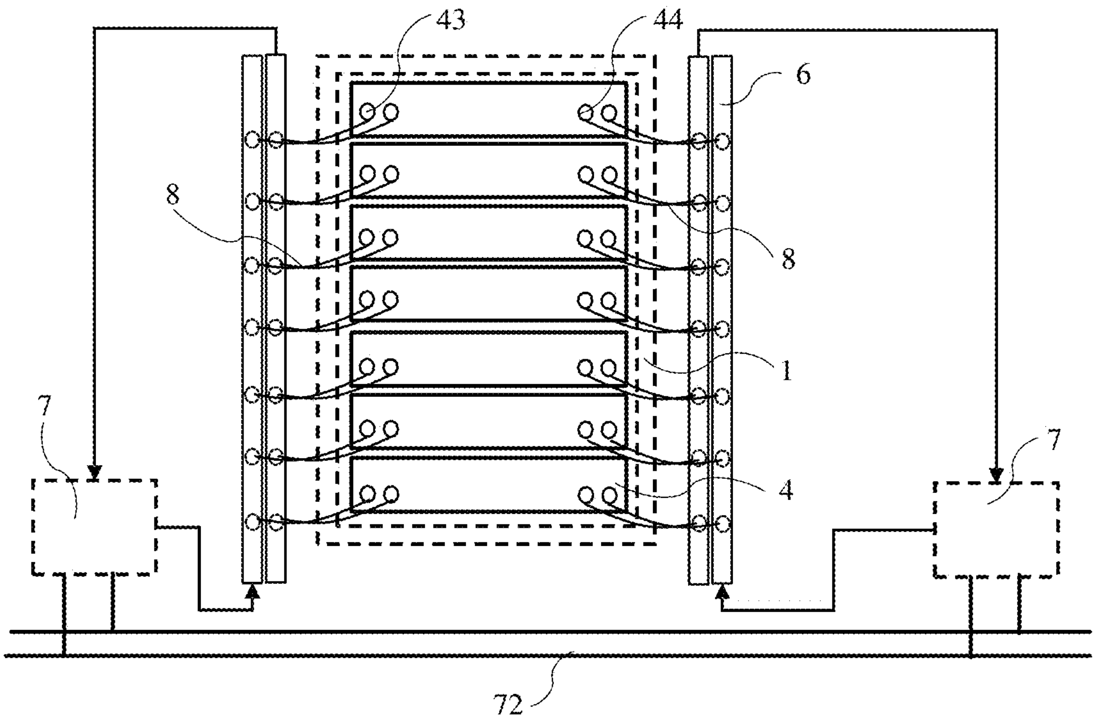
FIG. 17 is a schematic diagram of a structure of another connection of flow distribution units according to an embodiment of this disclosure.

As shown in FIG. 16 and FIG. 17, the flow distribution unit includes a liquid collector and a liquid separator, is configured to split or combine gas or fluid, and is usually configured to adjust a fluid flow in a hydraulic system, for example, flow distribution and pressure transfer of a cooling working medium between a pump and the cooling component 42.

Specifically, the flow distribution unit has two independent liquid runners. One of the liquid runners provides a runner for cold fluid, and is referred to as a liquid separator. The other one of the liquid runners provides a runner for hot fluid, and is referred to as a liquid collector. A plurality of liquid quick connectors are disposed on each liquid runner, and the liquid runner is connected to first connectors 43 or second connectors 44 of liquid cooling nodes 4, so that a coolant enters the liquid cooling nodes 4 to absorb heat. In the liquid separator, liquid in the liquid runner is distributed into each liquid cooling node 4, so that the coolant enters each liquid cooling node 4 to absorb heat. In the liquid collector, liquid in the liquid cooling nodes 4 converges to flow back into the liquid runner, so that the coolant in each liquid cooling node 4 enters the heat exchange modules 7 for heat exchange.

Further, quick connectors matching the first connectors 43 are disposed on the first flow distribution unit 5. The first flow distribution unit 5 is connected to the first connectors 43, and is configured to distribute and converge the first medium. One of the first connectors 43 of the liquid cooling node 4 is communicated with a liquid inlet side of the first flow distribution unit 5, and the other one of the first connectors 43 is communicated with a liquid outlet side of the first flow distribution unit 5, so that a closed cooling loop is formed between the first flow distribution unit 5 and the sealed compartment 41. Quick connectors matching the second connectors 44 are disposed on the second flow distribution unit 6. The second flow distribution unit 6 is connected to the second connectors 44, and is configured to distribute and converge the second medium. One of the second connectors 44 of the liquid cooling node 4 is communicated with a liquid inlet side of the second flow distribution unit 6, and the other one of the second connectors 44 is communicated with a liquid outlet side of the second flow distribution unit 6, so that a closed cooling loop is formed between the second flow distribution unit 6 and both of the cooling pipe 45 and the cooling component 42 that are in the sealed compartment 41.

Figure 18:
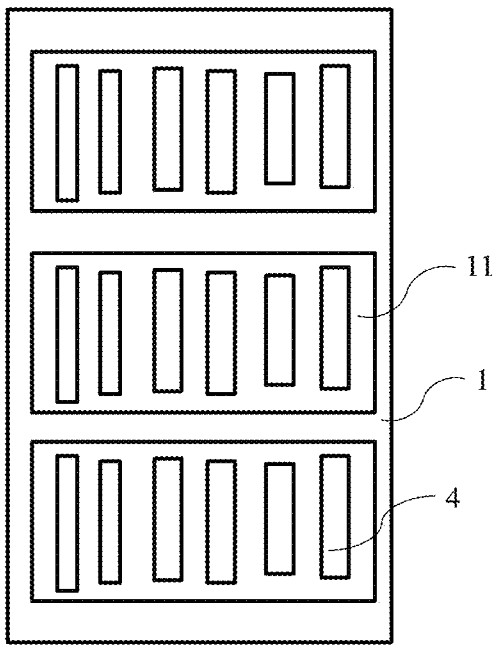
FIG. 18 is a schematic diagram of a front structure of a connection of flow distribution units of vertically inserted multi-chassis nodes.
Figure 19:
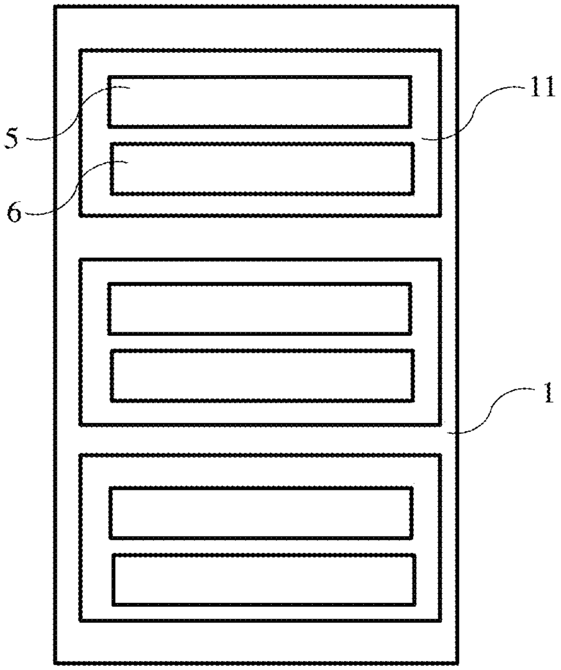
FIG. 19 is a schematic diagram of a rear structure of a connection of flow distribution units of vertically inserted multi-chassis nodes.

When the node is vertically inserted, and a plurality of chassis 11 (three chassis in the figure) are disposed in the cabinet body 1, there may also be a plurality of corresponding sets of flow distribution units (one first flow distribution unit 5 and one second flow distribution unit 6 are referred to as one set), and each chassis corresponds to one set, that is, one first flow distribution unit 5 and one second flow distribution unit 6 are disposed in each chassis 11, as shown in FIG. 18 and FIG. 19.

Still refer to FIG. 16 and FIG. 17. The first flow distribution unit 5 and the second flow distribution unit 6 may be installed on any side of the cabinet body 1, for example, a front side, a rear side, a left side, a right side, an upper side, or a lower side, and the first flow distribution unit 5 and the second flow distribution unit 6 may be installed on a same side of the cabinet body 1, so that an overall structure is more compact. The first flow distribution unit 5 and the second flow distribution unit 6 may alternatively be installed on different sides of the cabinet body 1, so that an overall structure is more flexibly arranged.

As shown in FIG. 16, in an embodiment, the first flow distribution unit 5 and the second flow distribution unit 6 are installed on the rear side of the cabinet body 1, and the first flow distribution unit 5 and the second flow distribution unit 6 may be fixed on a main structure of a rear part of the cabinet body 1. This structure enables two pairs of quick connectors (the two first connectors 43 and the two second connectors 44) in the liquid cooling node 4 to be installed in alignment with the two flow distribution units respectively. Specifically, the first flow distribution unit 5 can directly face the first connectors 43, so that the first flow distribution unit 5 and the first connectors 43 cooperate in a fast blind connection manner. Similarly, the second flow distribution unit 6 can directly face the second connectors 44, so that the second flow distribution unit 6 and the second connectors 44 cooperate in a fast blind connection manner.

As shown in FIG. 17, in another embodiment, the first flow distribution unit 5 and the second flow distribution unit 6 are installed on any side of the cabinet body 1, for example, the front side, the rear side, the left side, the right side, the upper side, or the lower side. Two pairs of quick connectors in the liquid cooling node 4 are respectively connected to the two flow distribution units through hoses 8, so that an installation position of the flow distribution unit is not limited, and flexibility of an overall structure of an apparatus is improved.

In still another embodiment, one of the first flow distribution unit 5 and the second flow distribution unit 6 cooperates in a quick blind connection manner, and the other is connected through hoses. For example, connection between the first connectors 43 and the first flow distribution unit 5 is performed in a floating blind-mate manner, and connection between the second connectors 44 and the second flow distribution unit 6 is performed through the hoses; or connection between the first connectors 43 and the first flow distribution unit 5 is performed through the hoses, and connection between the second connectors 44 and the second flow distribution unit 6 is performed in a floating blind-mate manner.

The foregoing descriptions are merely embodiments of this disclosure, and are not intended to limit this disclosure. For a person skilled in the art, this disclosure may have various modifications and variations. Any modification, equivalent replacement, or improvement made without departing from the spirit and principle of this disclosure shall fall within the protection scope of this disclosure.

What is claimed is:

1. A liquid cooling heat dissipation apparatus comprising:

a plurality of liquid cooling nodes, wherein each of the liquid cooling nodes comprises:

a sealed compartment, wherein the sealed compartment is filled with a first medium;

at least one cooling component, disposed in the sealed compartment, wherein the cooling component is filled with a second medium;

two first connectors, disposed on a side wall of the sealed compartment, and configured to communicate with the sealed compartment to form a first cooling path; and two second connectors, disposed on the side wall of the sealed compartment, and configured to communicate with the at least one cooling component to form a second cooling path, and a first flow distributor configured to distribute the first medium for the plurality of liquid cooling nodes, wherein one of the two first connectors of each of the liquid cooling nodes is configured to communicate with a liquid inlet side of the first flow distributor, and the other one of the two first connectors is configured to communicate with a liquid outlet side of the first flow distributor, and wherein the two first connectors are quick blind-mate connectors; and a second flow distributor, configured to distribute the second medium, wherein one of the two second connectors of each of the liquid cooling nodes is configured to communicate with a liquid inlet side of the second flow distributor, and the other one of the two second connectors is configured to communicate with a liquid outlet side of the second flow distributor, and wherein the two second connectors are quick blind-mate connectors.

2. The liquid cooling heat dissipation apparatus according to claim 1, wherein, for each of the liquid cooling nodes, a heat generation component is disposed in the sealed compartment, the cooling component forms a closed structure, the cooling component is attached to a surface of the heat generation component.

3. The liquid cooling heat dissipation apparatus according to claim 1, wherein, for each of the liquid cooling nodes, a heat generation component is disposed in the sealed compartment, the cooling component is disposed as a cavity structure with an opening on one side, an opening side of the cooling component is connected to the heat generation component, and the heat generation component closes the opening side of the cooling component to form a closed structure.

4. The liquid cooling heat dissipation apparatus according to claim 1, wherein the first medium and the second medium are a same type of cooling liquid.

5. The liquid cooling heat dissipation apparatus according to claim 1, wherein the first medium and the second medium are different types of cooling liquid.

6. The liquid cooling heat dissipation apparatus according to claim 1, wherein the first medium is a non-aqueous single-phase working medium, and the second medium is water or a two-phase working medium.

7. The liquid cooling heat dissipation apparatus according to claim 1, wherein the first medium is a non-aqueous two-phase working medium, and the two first connectors are arranged in a vertical direction.

8. The liquid cooling heat dissipation apparatus according to claim 1, wherein the second medium is an aqueous working medium.

9. The liquid cooling heat dissipation apparatus according to claim 1, wherein, for each of the liquid cooling nodes, the at least one cooling component comprises a plurality of cooling components, and the plurality of cooling components are configured to communicate with each other.

10. The liquid cooling heat dissipation apparatus according to claim 1, wherein, for each of the liquid cooling nodes, a circuit board is disposed in the sealed compartment, and a first chip and a second chip are disposed on the circuit board; and the first chip is in contact with the cooling component, and at least a part of the second chip is immersed in the first medium.

11. The liquid cooling heat dissipation apparatus according to claim 1, wherein the first flow distributor and the second flow distributor are disposed on a same side of a cabinet body of the liquid cooling heat dissipation apparatus.

12. The liquid cooling heat dissipation apparatus according to claim 1, wherein the first flow distributor and the second flow distributor are disposed on different sides of a cabinet body of the liquid cooling beat dissipation apparatus.

13. The liquid cooling heat dissipation apparatus according to claim 1, wherein the two first connectors and the two second connectors are disposed at a rear part of the sealed compartment in an insertion and removal direction.

14. The liquid cooling heat dissipation apparatus according to claim 1, wherein the at least one cooling component is disposed as a cavity structure with an opening on one side, an opening side of the cooling component is connected to a heat generation component, the heat generation component closes the opening side to form a closed structure, and a nozzle is disposed in the cooling component and configured to spray the second medium onto a surface of the heat generation component.

15. The liquid cooling heat dissipation apparatus according to claim 1, wherein the first medium is a low-pressure non-aqueous working medium and the second medium is a high-pressure non-aqueous working medium of the same type as the first medium.

16. A liquid cooling heat dissipation cabinet comprising:

a cabinet body;

a plurality of liquid cooling nodes, and the liquid cooling nodes are detachably installed on the cabinet body, wherein each of the liquid cooling nodes comprises two first connectors and two second connectors;

a first flow distributor, configured to distribute a first medium, wherein one of the two first connectors of at least one of the liquid cooling nodes is configured to communicate with a liquid inlet side of the first flow distributor, and the other one of the two first connectors is configured to communicate with a liquid outlet side of the first flow distributor; and a second flow distributor, configured to distribute a second medium, wherein one of the two second connectors of the at least one of the liquid cooling nodes is configured to communicate with a liquid inlet side of the second flow distributor, and the other one of the two second connectors is configured to communicate with a liquid outlet side of the second flow distributor, wherein each of the liquid cooling nodes further comprises:

a sealed compartment, wherein the sealed compartment is filled with a first medium; and at least one cooling component, disposed in the sealed compartment, wherein the cooling component is filled with a second medium;

the two first connectors are disposed on a side wall of the sealed compartment, and are configured to communicate with the sealed compartment to form a first cooling path; and the two second connectors are disposed on the side wall of the sealed compartment, and are configured to communicate with the at least one cooling component to form a second cooling path; and wherein the liquid cooling heat dissipation cabinet comprises one heat exchange module, the heat exchange module comprises two heat exchange branches that are configured to not communicate with each other, the first flow distributor is configured to communicate with one of the heat exchange branches, and the second flow distributor is configured to communicate with the other one of the heat exchange branches.

17. A liquid cooling heat dissipation cabinet comprising:

a cabinet body;

a plurality of liquid cooling nodes, and the liquid cooling nodes are detachably installed on the cabinet body, wherein each of the liquid cooling nodes comprises two first connectors and two second connectors;

a first flow distributor, configured to distribute a first medium, wherein one of the two first connectors of at least one of the liquid cooling nodes is configured to communicate with a liquid inlet side of the first flow distributor, and the other one of the two first connectors is configured to communicate with a liquid outlet side of the first flow distributor; and a second flow distributor, configured to distribute a second medium, wherein one of the two second connectors of the at least one of the liquid cooling nodes is configured to communicate with a liquid inlet side of the second flow distributor, and the other one of the two second connectors is configured to communicate with a liquid outlet side of the second flow distributor;

wherein each of the liquid cooling nodes further comprises:

a sealed compartment, wherein the sealed compartment is filled with a first medium; and at least one cooling component, disposed in the sealed compartment, wherein the cooling component is filled with a second medium, the two first connectors are disposed on a side wall of the sealed compartment, and are configured to communicate with the sealed compartment to form a first cooling path; and the two second connectors are disposed on the side wall of the sealed compartment, and are configured to communicate with the at least one cooling component to form a second cooling path; and wherein the liquid cooling heat dissipation cabinet comprises two heat exchange modules, the first flow distributor is configured to communicate with one of the heat exchange modules, and the second flow distributor is configured to communicate with the other one of the heat exchange modules.

* * * * *